US 9,081,293 B2

(12) United States Patent
Cheng et al.

(10) Patent No.: US 9,081,293 B2
(45) Date of Patent: Jul. 14, 2015

(54) SYSTEM AND METHOD FOR LITHOGRAPHY EXPOSURE WITH CORRECTION OF OVERLAY SHIFT INDUCED BY MASK HEATING

(71) Applicant: Taiwan Semiconductor Manufacturing Company, Ltd., Hsin-Chu (TW)

(72) Inventors: Dong-Hsu Cheng, Tainan (TW); Chun-Jen Chen, Jhubei (TW); Ming-Ho Tsai, Hsinchu (TW); Jim Liang, Hsinchu (TW); Yung-Hsiang Chen, New Taipei (TW); Jun-Hua Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/056,576

(22) Filed: Oct. 17, 2013

(65) Prior Publication Data
US 2014/0272717 A1    Sep. 18, 2014

Related U.S. Application Data

(60) Provisional application No. 61/777,992, filed on Mar. 12, 2013.

(51) Int. Cl.
*G06F 17/50* (2006.01)
*G03F 1/70* (2012.01)
*G03F 7/00* (2006.01)

(52) U.S. Cl.
CPC ... *G03F 1/70* (2013.01); *G03F 7/00* (2013.01)

(58) Field of Classification Search
CPC ........... G06F 17/5068; G06F 17/5081; G06F 2217/12; G03F 1/36; G03F 1/144; G03F 7/70441; G03F 7/70633; G03F 7/70258; G03F 7/70358; G03F 7/70683; G03F 9/7084; G03F 7/70433; G03F 9/7011; H01L 22/20; H01L 27/0207; H01L 22/34; G05B 19/402; G05B 19/41885; G05B 2219/45031
USPC ............. 716/51, 52, 53, 54, 55, 56, 111, 112
See application file for complete search history.

(56) References Cited

U.S. PATENT DOCUMENTS

2005/0177811 A1* 8/2005 Kotani et al. .................... 716/21
2005/0273754 A1* 12/2005 Nojima et al. .................. 716/21
2008/0215276 A1* 9/2008 Fang et al. ...................... 702/84

* cited by examiner

*Primary Examiner* — Vuthe Siek
(74) *Attorney, Agent, or Firm* — Haynes and Boone, LLP

(57) ABSTRACT

A method of exposing a wafer substrate includes receiving an integrated circuit (IC) design layout defining a pattern; determining a temperature profile of a mask based on the IC design layout, the pattern being formed on the mask; calculating a pre-corrected overlay shift for the mask based on the calculated temperature profile; and exposing a resist layer coated on a substrate using the mask with overlay compensation based on the pre-corrected overlay shift.

20 Claims, 9 Drawing Sheets

SYSTEM AND METHOD FOR LITHOGRAPHY EXPOSURE WITH CORRECTION OF OVERLAY SHIFT INDUCED BY MASK HEATING

CROSS REFERENCE

This application claims the benefit of U.S. Provisional Application No. 61/777992 entitled "SYSTEM AND METHOD FOR LITHOGRAPHY EXPOSURE WITH CORRECTIVE OF OVERLAY SHIFT INDUCED BY MASK HEATING" filed Mar. 12, 2013, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

With small feature sizes in advanced technology nodes, lithography patterning faces more challenges. For example, overlay error needs to much smaller since feature size is reduced. On the other hand, lithography technology uses a radiation beam of high energy photons, such as deep ultraviolet (DUV) or extreme ultraviolet (EUV), since high energy photons have short wavelength and high resolution that enable formation of small size features.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
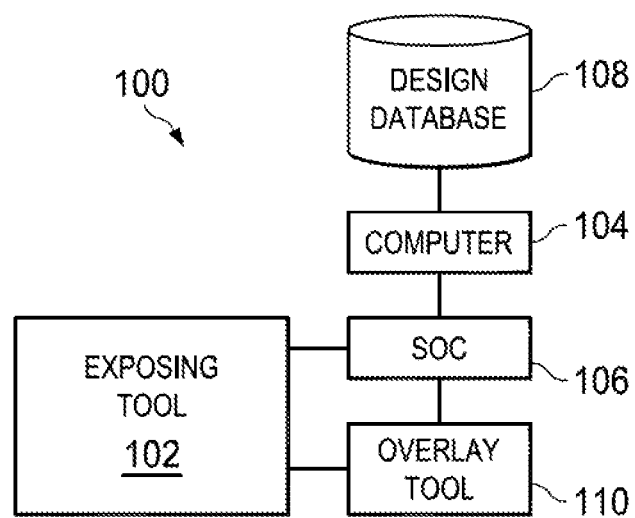
FIG. 1 is a block diagram of a lithography system constructed according to one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram illustrating a system 100 for implementing a lithography process constructed according to aspects of the present disclosure in one or more embodiment. It is understood that other configurations and inclusion or omission of various items in the system 100 may be possible. The system 100 is exemplary, and is not intended to limit the disclosure beyond what is explicitly recited in the claims. The system 100 includes an exposing tool 102 designed to perform an exposure process during lithography patterning.

Figure 2:
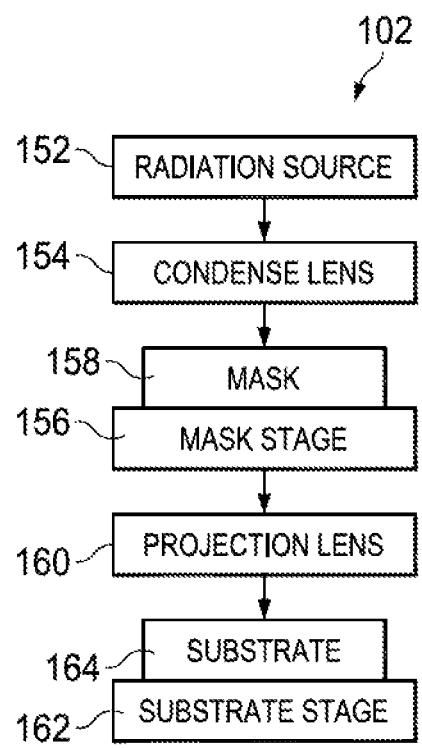
FIG. 2 is a schematic diagram of an exposing tool constructed according to one or more embodiments.

The exposing tool 102 is further described with reference to FIG. 2 in a schematic view, constructed according to aspects of the present disclosure in one or more embodiment. The exposing tool 102 is operable to expose a photoresist (or resist) layer coated on a substrate. The exposing tool 102 includes a radiation source (illumination source) 152 to generate radiation energy (or radiation beam) to expose the resist layer. The radiation energy includes I-line light or a deep ultraviolet (DUV) light in various examples.

The exposing tool 102 includes an illumination module with various optical components configured to image a mask onto a wafer. The illumination module may include multiple lenses and/or other optical components. In the present embodiment, the illumination module includes a condenser 154 and a projection lens 160.

The exposing tool 102 also includes a mask stage 156 designed to secure a mask (also referred to as reticle or photo mask) 158 and configured between the condenser and the projection lens. The mask 158 has a pattern to be transferred to a semiconductor wafer. The mask 158 includes a substrate and a patterned layer formed on the substrate.

In some embodiments, the mask 158 includes a transparent substrate and a patterned absorption layer. The transparent substrate may use fused silica (SiO$_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

In other embodiments, the mask 158 is a reflective mask used in an extreme ultraviolet (EUV) lithography system. The reflective mask includes a substrate of a low thermal expansion material (LTEM) and a reflective multilayer film formed on the substrate. The reflective mask further includes an absorption layer patterned to form a main pattern according to an IC design layout.

The exposing tool 102 also includes a substrate stage 162 designed to secure a substrate 164 and is operable to move transitionally and/or rotationally. The substrate 164 may be a semiconductor wafer, such as a silicon wafer, or other suitable substrate to be patterned.

Back to FIG. 1, the system 100 includes a smart overlay controller (SOC) 106. The smart overlay controller 106 calculates a predicted overlay using the temperature profile of the mask and creates a sub-recipe for the mask to offset the temperature impact on overlay performance.

In some embodiments, the SOC 106 is operable to build a thermal model specific to the mask and predict the mask thermal profile over time (or a number of wafers processed) based on the IC design layout defined on the mask and exposing condition, such as dose and illumination field. The SOC 106 is operable to further determine overlay shift correction based on the mask thermal model and further feedback to the exposing tool for proper overlay shift correction.

The system 100 includes an integrated circuit (IC) design database 108. The IC design database 108 is designed to hold IC design layout data and is coupled to the SOC 106. In some embodiments, the IC design database 108 includes a plurality of IC design layouts which will be transferred onto a semiconductor substrate, such as a semiconductor wafer, to form various circuit components. The circuit components include a transistor, a capacitor, a resistor, and/or a metal line connecting the IC devices. An IC design layout includes an IC pattern having a plurality of IC features. The IC pattern is formed on a mask. In a lithography process, the IC pattern (with the IC features) is transferred to a resist layer coated on the substrate using the mask and the exposing tool.

In alternative embodiments, the system 100 further includes a computer 104 where the mask thermal model is generated by the computer. In this case, the IC design database 108 is coupled with the computer 104. In some embodiments, the computer 104 is a standard, general-purpose computer, including a processor, memory, and an interface. The computer 104 may be a single computer or a distributed computer, and connects to various components of the design database 108, the smart overlay controller 106, and the exposing tool 102, including but not limited to the connections shown in FIG. 1. In the present embodiments, the computer 104 calculates and predicts a process parameter using information from the design database 102 and the exposing tool. For example, the computer 104 may calculate a temperature profile of the mask using mask parameters (or mask data), such as pattern density, and illumination parameters (or exposing data) of the exposing tool 106, such as radiation source type and a dose, by simulating exposing the mask on the exposing tool. The computer 104 includes one or more software programs for calculating and predicting the temperature profile.

The system 100 also includes an overlay tool 110 coupled with the exposing tool 102. The overlay tool 110 is designed to measure an overly error of a resist pattern formed on the substrate 164 according to the mask 158. The overlay tool 110 also coupled with the smart overlay controller 106. The overlay tool 110 receives the substrate with the resist pattern, performs an overlay measurement of the resist pattern to obtain the overly error of the resist pattern, and may send the overlay error to the smart overlay controller 106 for further optimizing the sub-recipe if the overlay error is beyond a specification limit. The system 100 is described according to various embodiments. However, in different embodiments, the various modules of the system 100 may be integrated together, or may be distributed in different locations and coupled together through intranet or Internet. In other embodiments, various functions may be built in different modules, such as the mask thermal model may be generated by the computer 104 or the SOC 106.

Figure 3:
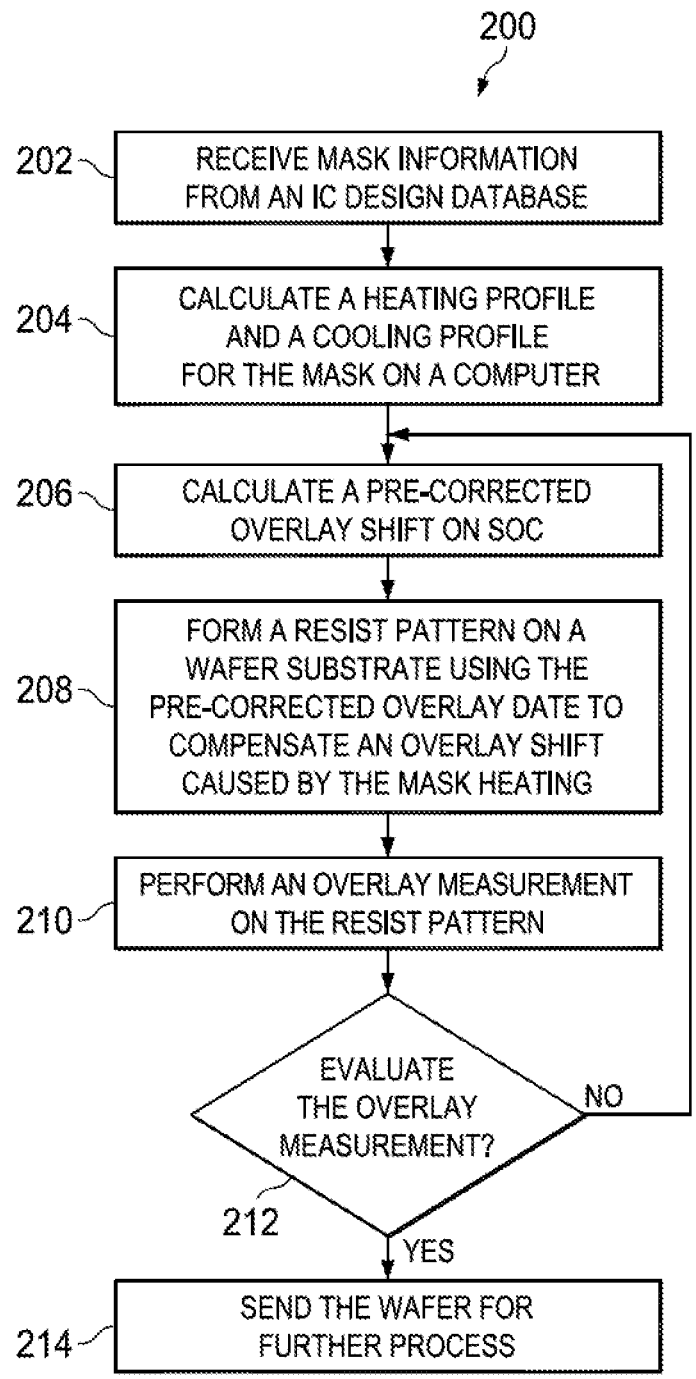
FIG. 3 is a flowchart of a method of a lithography process constructed according to one or more embodiments.

FIG. 3 is a flowchart of a method 200 for lithography patterning to form a resist pattern, constructed according to one or more embodiments. In some embodiments, the method 200 is implemented in the system 100. It is understood that additional steps can be provided before, during, and after the method 200, and some steps described can be replaced, eliminated, or moved around for additional embodiments of the method 200. The method 200 is an example, and is not intended to limit the disclosure beyond what is explicitly recited in the claims.

The method 200 begins at operation 202 by receiving information of a mask, such as from an IC design database 108. The IC design database 108 includes a plurality of design layouts. The IC design database may be located in a mask shop, or is part of the wafer fab. The IC design database may also belong to a customer design house. The mask includes a binary mask (BIM), or a phase shift mask (PSM). The phase shift mask may be an alternative phase shift mask (alt. PSM) or an attenuated phase shift mask (att. PSM). The mask may include a transmittance mask used in an I-line or a deep ultraviolet (DUV) tool, or a reflective mask used in an extreme ultraviolet (EUV) tool. The mask is fabricated according to the IC design layout. In some embodiments, the mask includes a light transmittance portion and a light block portion and therefore the mask can transfer a pattern to a resist film deposited on a wafer substrate by blocking or passing the portion of the light according to the IC design layout. The blocked light is absorbed by the light block portion, such as Cr, Mo or an absorber layer. According to one or more embodiments, absorbed light can heat the mask to a higher temperature. The radiation light heats the mask and causes mask distortion, which further introduces overlay shift during a lithography exposure process. Accordingly, the heated mask may impact capability of fabricating an IC device, which will be discussed in more detail below. The information of the mask includes a pattern density (PD) of the mask. In some embodiments, the pattern density is defined as a ratio of area not occupied by the light block layer to total area of a mask plate. For example, if the total area of a mask plate is 10,000 $mm^2$ and 6,500 $mm^2$ is covered by the light block layer, the pattern density of the mask is 35%.

In other embodiments, the operation 202 further includes receive exposing conditions, such as exposure field, illumination light and dosage.

The method 200 proceeds to operation 204 by calculating a heating profile and a cooling profile of the mask. The heating profile and cooling profile of the mask are calculated based on the mask data including mask pattern (the corresponding design layout), such as pattern density. The mask data also includes mask type (binary mask or phase shift mask) and mask tone. The heating profile and a cooling profile of the mask are calculated based on exposure data, such as exposure field area and exposure dosage. Collectively, from the heating profile and the cooling profile, a mask thermal model is built. The mask thermal model is used to predict the mask temperature over time (or over wafer sequence of a lot during lithography exposure).

Figure 4:
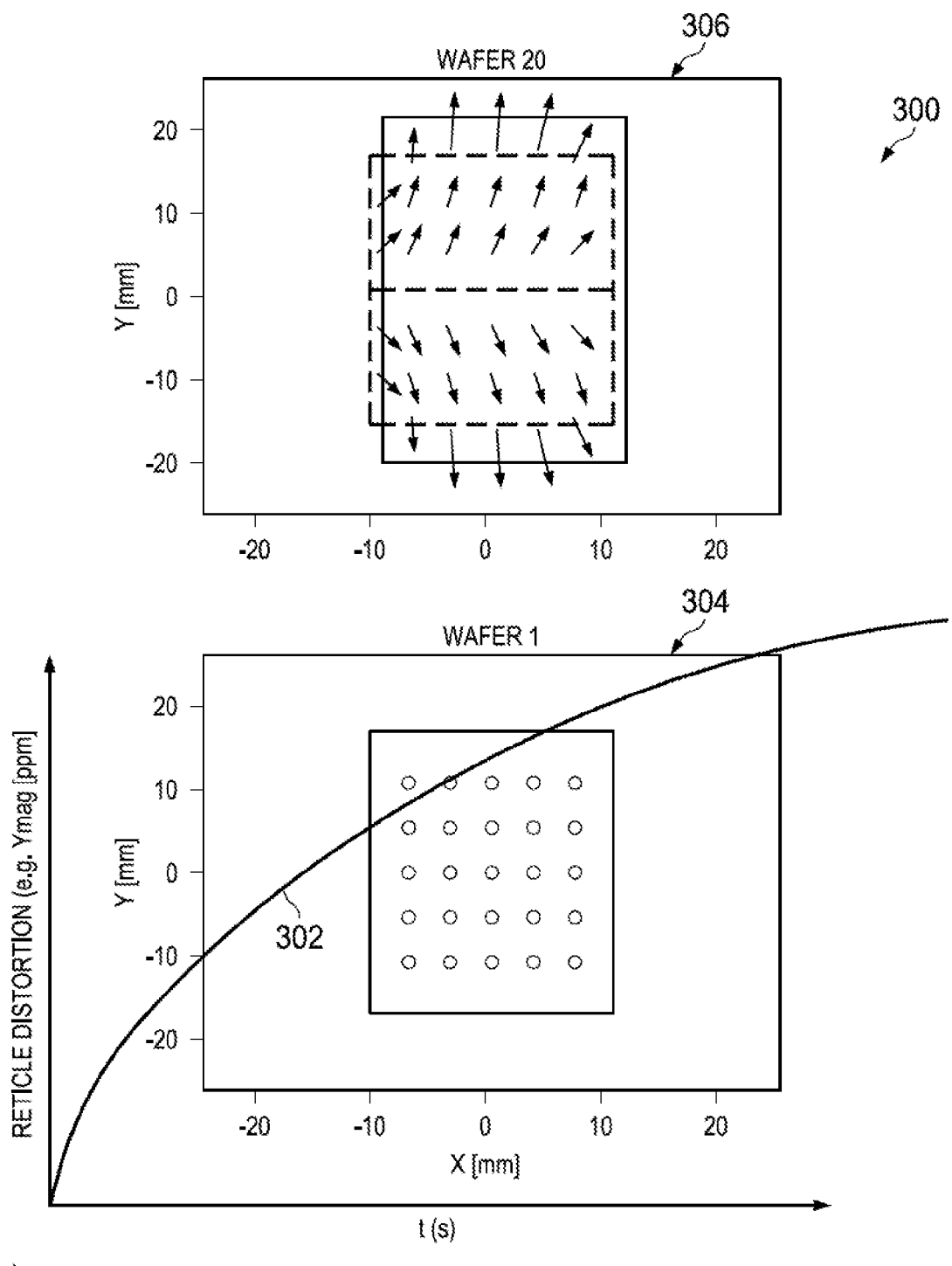
FIG. 4 illustrates mask distortion constructed according to one or more embodiments.

According to one or more embodiments, when a radiation beam is projected on the mask for exposing a wafer substrate, the radiation beam absorbed by the mask can heat the mask to a higher temperature and the heated mask may induce overlay shift of the pattern formed on the wafer substrate according to the mask. FIG. 4 illustrates one example 300 of mask heating effect. A mask distortion (e.g. Y mag) curve 302 shows that the mask distortion changes over heating time. FIG. 4 further illustrates a mask distortion distribution 304 in an exposure field on the first wafer of a lot and a mask distortion distribution 306 in the exposure field on the 25th wafer of the lot. In some embodiments, the mask distortion curve 302 shows the mask distortion (e.g. Y mag) is a function of the mask temperature (or heating time) and the mask distortion increases with the mask temperature (or heating time). In another embodiment, the mask distortion distribution 306 includes a distortion greater than the mask distortion distribution 304 because the mask distortion distribution 306 is obtained at a higher temperature (after longer heating time).

In some embodiments, the temperature of the mask is calculated by using a plurality of mask parameters and a plurality of illumination parameters. By calculating the temperature of the mask based on the IC design layout and exposure condition, the cost of installing hardware measuring the temperature on the mask can be saved. In one example, the cost of installing the hardware is about $ 1.4 M/per exposing tool. Furthermore, the hardware may be not available for some exposing tools.

Figure 5:
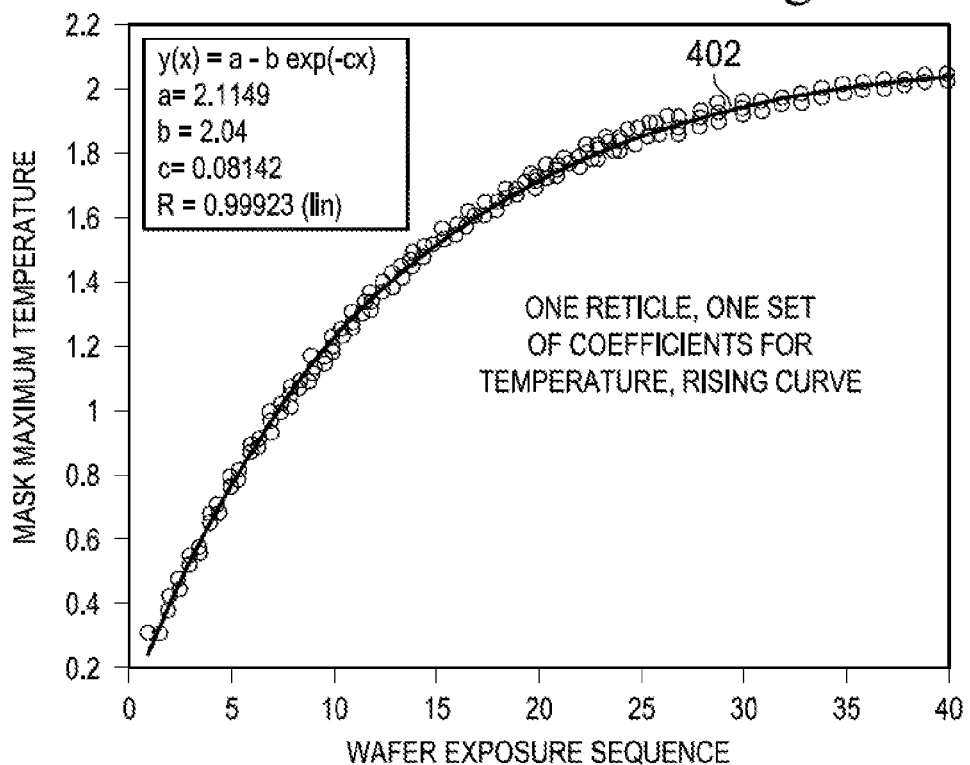
FIG. 5 is a diagram illustrating mask heating profile constructed according to various embodiments.
Figure 6:
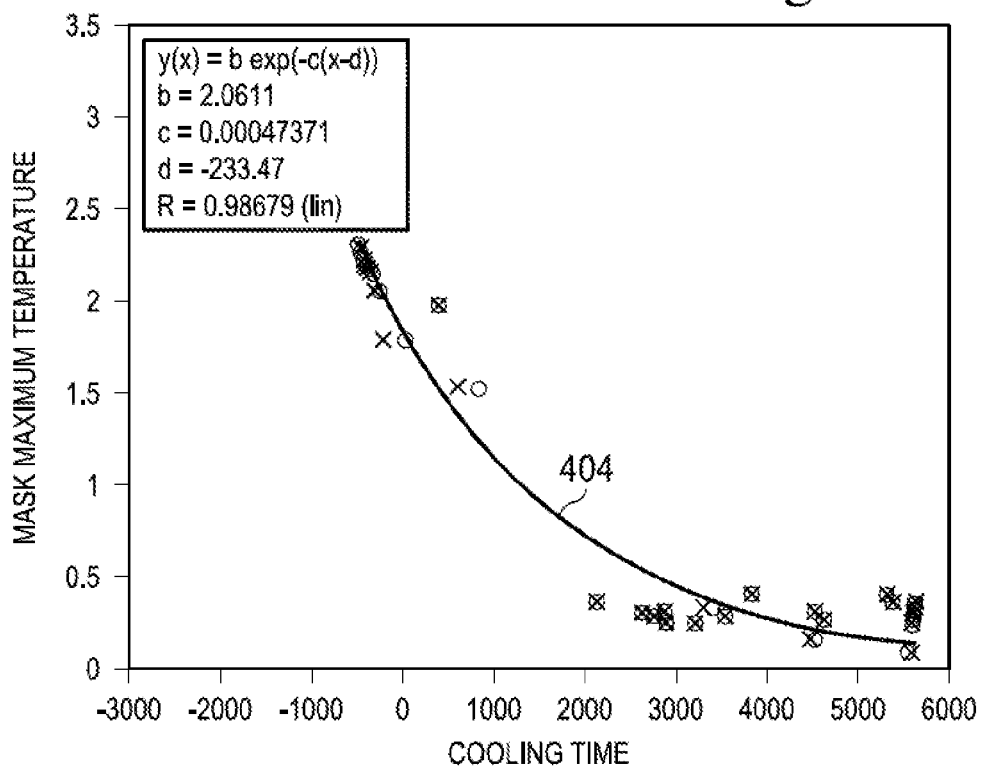
FIG. 6 is a diagram illustrating mask cooling profile constructed according to various embodiments.

FIGS. 5 and 6 illustrate a heating curve 402 (over a number of exposed wafers in a lot) and a cooling curve 404 (over cooling time) of the mask. A mask thermal (temperature) profile is calculated based the heating profile 402 and the cooling profile 404.

The mask temperature is a function of the number of exposed wafers in a lot. In some embodiments, the heating curve 402 of a mask is calculated by using the equation eq. 1, $$y = a1 - b1 * \exp(-c1 * x) \qquad \text{eq. 1}$$

In which, y is the mask temperature, and x is a number of exposed wafers in a lot. In eq. 1, a1, b1 and c1 are coefficients associated with the various mask data and the exposure data. Particularly, a1 is saturated temperature and c1 is heating rate.

The coefficients a1, b1 and c1 in the eq. 1 are further determined according to the mask data and the exposure data. State differently, each of the coefficients a1, b1 and c1 is expressed as a function of the mask data and the exposure data. In some embodiments, the mask data and the exposure data include mask transmission rate (Tr), mask pattern density (PD), exposure dosage (D), exposure field size (F) and field_x (Fx). F is an area of the exposure field and Fx is a dimension of the exposure field in a direction perpendicular to the scan direction during an exposure process. In furtherance of the embodiments, each of the coefficients a1, b1 and c1 is a respective functions of the mask data and exposure data, such as a1=f1(Tr, PD, D, F, Fx), b1=f2(Tr, PD, D, F, Fx), and c1=f3(Tr, PD, D, F, Fx). f1, f2 and f3 represent different mathematical functions.

In other embodiments, those functions (f1, f2 and f3) are linear functions, such as those provided in Eq. 2 according to some embodiments:

$$a1 = K0 + K1*Fx + K2*D + K3*Tr + K4*PD$$

$$b1 = L0 + L1*Fx + L2*D + L3*Tr + L4*PD$$

$$c1 = M0 + M1*F + M2*Tr + M3*PD \qquad \text{eq. 2}$$

where K0, K1, K2, K3, K4, L0, L1, L2, L3, L4, M0, M1, M2, and M3 are constants.

In other embodiments, the cooling curve 304 of the mask is calculated by using the eq. 3

$$y = \exp(-c2*(x-d2)) \qquad \text{eq. 3}$$

in which y is mask temperature, and x is mask cooling time. In eq. 3, c2 and d2 are coefficients associated with the various mask data and the exposure data. Particularly, c2 is cooling rate.

The coefficients c2 and d2 in the eq. 3 are further determined according to the mask data and the exposure data. State differently, each of the coefficients c2 and d2 is expressed as a function of the mask data and the exposure data. In some embodiments, each of the coefficients c2 and d2 is a respective functions of the mask data and exposure data, such as c2=f4(Tr, PD, D, F, Fx), and d2=f5(Tr, PD, D, F, Fx), in which f4 and f5 represent different mathematical functions.

In other embodiments, those functions (f4 and f5) are linear functions, such as those provided in Eq. 4 according to some embodiments:

$$c2 = P0 + P1*Tr + P2*D$$

$$d2 = Q0 + Q1*Tr + Q2*PD + Q3*D + Q4*Fx \qquad \text{eq. 4}$$

where P0, P1, P2, Q0, Q1, Q2, Q3 and Q4 are constants.

In the present embodiments, calculating a temperature profile of a mask includes predicting an initial temperature of the mask while beginning exposing one lot of wafers on an exposing tool and predicting a raised temperature of the mask after exposing each of the wafers in the lot. Predicting the initial temperature of the mask also includes predicting the temperature of the mask over a cooling time after the completion of exposing the wafers in the lot.

Figure 7:
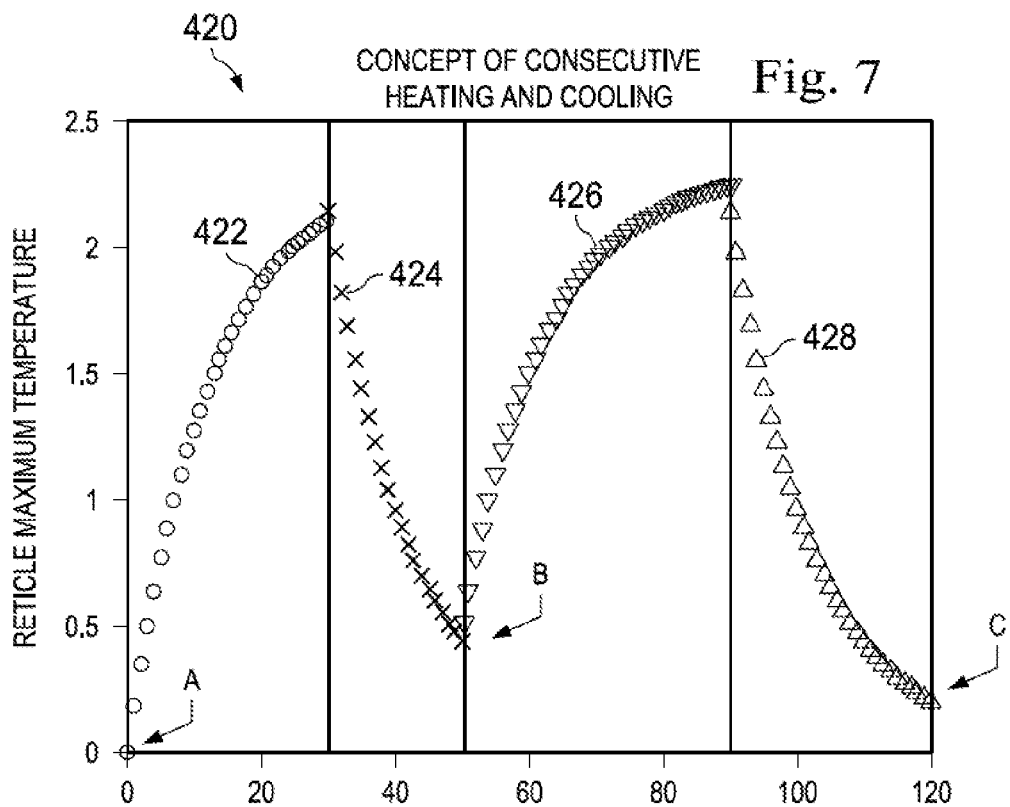
FIG. 7 is a diagram illustrating mask thermal profile constructed according to various embodiments.

FIG. 7 illustrates a mask temperature profile 420 of a mask through exposing two lots of wafers. The mask temperature profile 420 includes a first heating curve 422, a first cooling curve 424, a second heating curve 426, and a second cooling curve 428. In the present example, each curve is described by eq. 1 associated with the mask data and the exposure data. Each curve may be described by eq. 3 associated with the mask data and the exposure data. The temperature profile 420 also includes a first initial temperature A, a second initial temperature B, and a third initial temperature C. The first initial temperature A is the temperature on the mask when beginning exposing the first lot of wafers on the exposing tool. The first heating curve 422 represents the temperature on the mask when exposing each of the first lot of the wafers. The first cooling curve 424 represents the temperature on the mask when cooling the mask after the completion of exposing the wafers in the first lot. The second initial temperature B is the temperature on the mask when beginning exposing the second lot of wafers on the exposing tool. The second heating curve 426 represents the temperature on the mask when exposing each of the second lot of the wafers. The second cooling curve 428 represents the temperature on the mask when cooling the mast after the completion of exposing the wafers in the second lot. In some embodiments, the third initial temperature C may be used as the initial temperature for exposing the wafers in the next lot.

Figure 14:
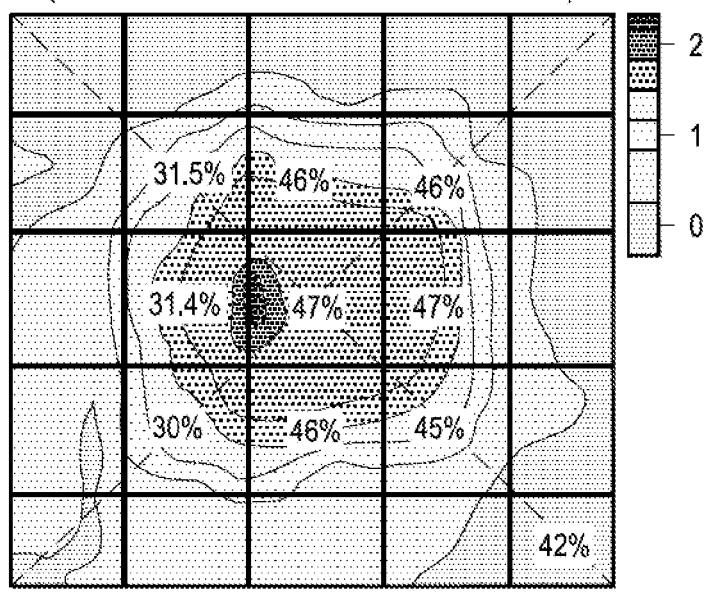
FIG. 14 illustrates various embodiments of a mask temperature distribution.
Figure 15:
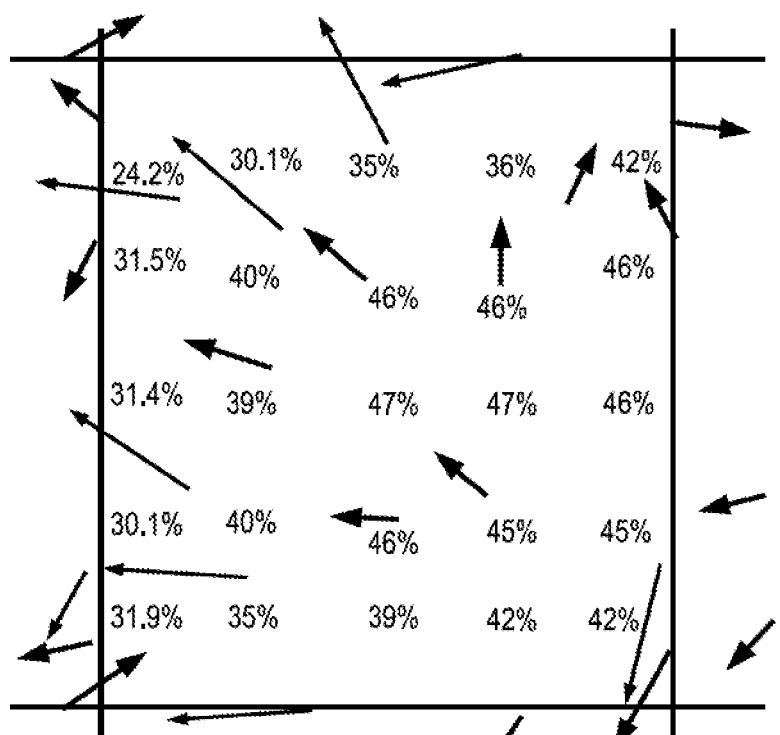
FIG. 15 illustrates various embodiments of wafer overlay associated with the mask temperature distribution.

In some embodiments, the IC pattern is not uniformly distributed on the mask. Therefore, the raised temperature is not distributed on the mask uniformly. According to one or more embodiments, the raised temperature is correlated with a local pattern density on the mask. In some embodiments, a low pattern density means less light passes through, more light is absorbed, and a high temperature is raised. Higher temperature causes more overlay shift. FIG. 14 illustrates a mask temperature distribution associated with local pattern density. FIG. 15 illustrates wafer overlay associated with mask temperature distribution. According to one or more embodiment, calculating the heating profile or the cooling profile also includes predicting the raised temperature distribution on the mask. In this case, the mask temperature profile is a function of both mask location and time.

Figure 8:
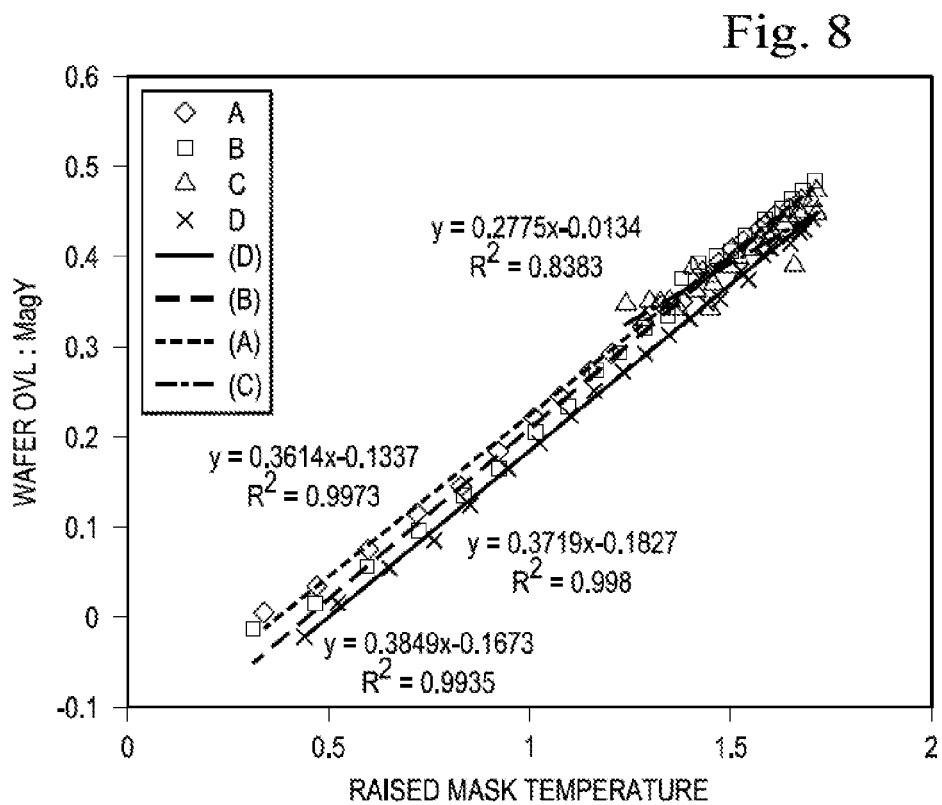
FIG. 8 is a diagram illustrating wafer overlay shift constructed according to one or more embodiments.

The method 200 proceeds to operation 206 by calculating a pre-corrected overlay (or overlay shift correction) for compensating the overlay impact caused by radiation beam heating on the mask. According to one or more embodiments, the overlay shift caused by the thermal expansion of the mask is correlated with the raised temperature of the mask. FIG. 8 illustrates one example of the wafer overlay shift (e.g. Mag Y) over the mask temperature. The overlay shift includes groups A, B, C and D associated by respective mask. For each group, the wafer overlay is correlated with the raised mask temperature. By the raised temperature calculated at operation 204, a pre-corrected overlay for the mask is calculated and provided to the exposing tool as a sub-recipe to compensate the overlay error caused from the mask heating. This may be implemented by the SOC 106. In some embodiments as shown in FIG. 8, the wafer overlay is a linear function of the mask temperature.

The method 200 proceeds to operation 208 by forming a resist pattern on a wafer substrate. The operation 208 may be implemented in the exposing tool 102. Forming the resist pattern on the substrate includes exposing a resist film coated on the substrate by an exposing tool with a mask. Especially, exposing the resist film includes using the pre-corrected overlay in an exposing recipe to compensate the overlay shift caused by the mask heating. Forming the resist pattern on the wafer substrate also includes developing the exposed resist film by a developer.

The method 200 may include other operations described below. In the present embodiment, the method 200 further proceeds to operation 210 by performing an overlay measurement on the resist pattern using an overlay tool 110.

The method 200 may proceed to operation 212 by evaluating the overlay measurement result of the resist pattern exposed by using the pre-corrected overlay shift to validate the pre-corrected overlay shift. For example, if the overlay measurement result of resist pattern is within a specification, the pre-corrected overlay shift is valid and the wafer substrate with the resist pattern is sent on to a subsequent process, such as an etching or implant process. Otherwise, if the overlay measurement result of the resist pattern is out of specification, the overlay measurement result is fed back to operation 206 for further optimizing the pre-corrected overlay shift on the SOC 106. In the present embodiments, the method 200 may proceed to operation 208 again by exposing the resist film using the optimized pre-corrected overlay shift, proceed to operation 210 by performing an overlay measurement, and proceed to operation 212 by evaluating the overlay measurement result. This cycle may be repeated until the overlay measurement result is within the specification.

The method 200 may proceed to operation 214 by sending the wafer substrate with the resist pattern for further processing. The further processing may include an implant process to form a well or a source/drain on the wafer substrate. The process may also include an etching process to transfer the resist pattern into the wafer substrate, further forming various features on the wafer substrate, such as isolation features or interconnection features.

Figure 9:
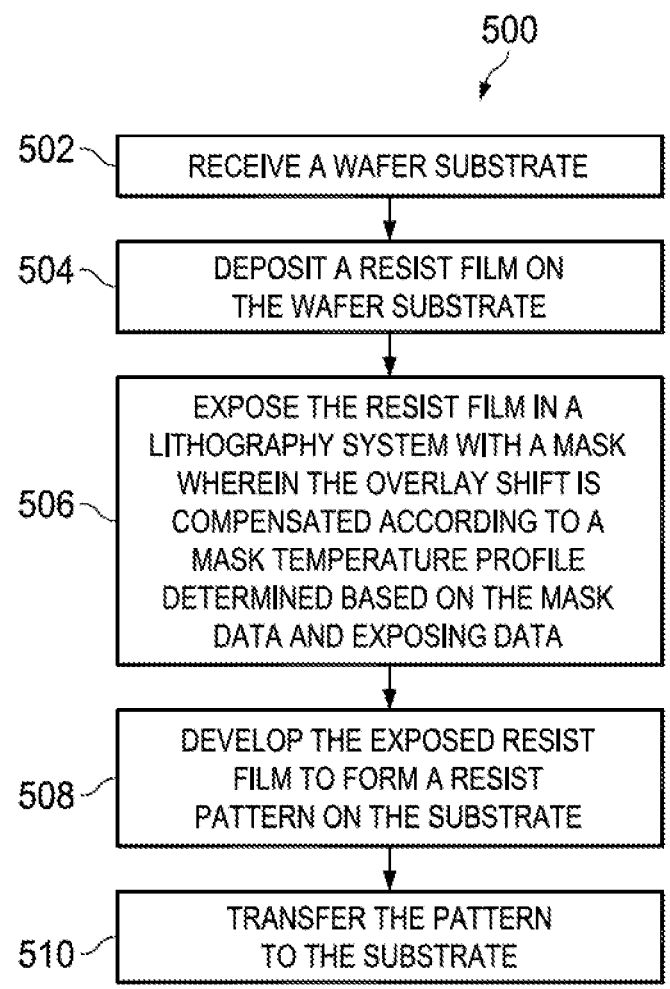
FIG. 9 is a flowchart of a method for patterning a semiconductor structure constructed according to one or more embodiments.

FIG. 9 illustrates a flowchart of a method 500 for forming a pattern on a semiconductor substrate. It is understood that additional steps can be provided before, during, and after the method 500, and some steps described can be replaced, eliminated, or moved around for additional embodiments of the method. The method 500 will be further described below, and more specific embodiment of the forming a semiconductor structure 600 by the method 500 will concurrently be described with reference to FIGS. 10-13 as sectional views of the semiconductor structure 600 at various fabrication stages.

The method 500 begins at 502 by receiving or providing a substrate 602. In some embodiments, the substrate 602 includes a silicon wafer. Alternatively or additionally, the substrate 602 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In various embodiments, the substrate 602 may include a plurality of circuit features, such as an isolation feature, a doped well, a source/drain, a gate, a via feature or a metal line.

Figure 10:
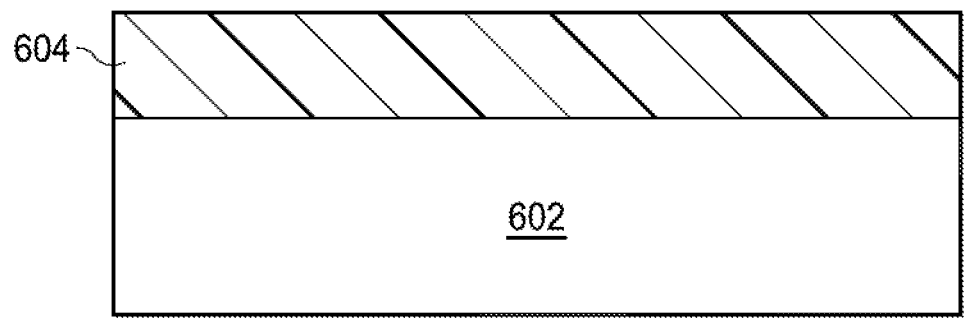
FIGS. 10-13 are sectional views of a semiconductor substrate at various fabrication stages constructed according to one or more embodiments.

The method 500 proceeds to operation 504 by forming a resist film on the wafer substrate. Referring to FIG. 10, a resist film 604 is coated on the substrate 602 by a suitable technique, such as spin-on coating. The resist film 604 may be a positive resist or a negative resist. The resist film 604 may include a single layer resist film or a multiple layer resist film. In the present example, forming a resist film includes performing a dehydration process before applying the resist on the substrate, which can enhance an adhesion of the resist film to the wafer substrate. The dehydration process may include baking the wafer substrate at a high temperature for duration of time, or applying a chemical such as hexamethyldisilizane (HMDS) to the substrate. Depositing a resist film may also include a soft bake (SB) process to drive a solvent out of a resist film and increase mechanical strength of a resist film. Depositing a resist film may include applying an antireflective coating, such as a bottom antireflective coating (BARC) or a top antireflective coating (TARC).

Figure 11:
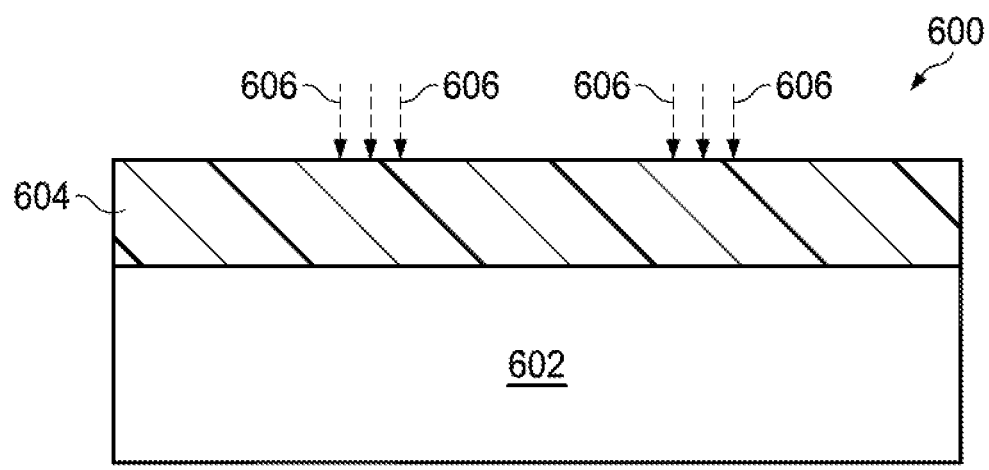

The method 500 proceeds to operation 506 by exposing the resist film 604 by the system 100 using a mask. Particularly, the operation 506 includes various actions. The raised temperature on the mask is calculated (such as by the computer 104) based on the mask data from the corresponding IC design data while exposing the resist film 604. The SOC 106 calculates a pre-corrected overlay shift based on the raised temperature on the mask. The exposing tool 102 exposes the resist film 604 with overlay compensation using the pre-calculated overlay shift. In various embodiments, the mask is a binary mask, a phase shift mask, or a reflective mask. The exposing tool 102 includes an I-line tool, DUV tool, or EUV tool. As illustrated in FIG. 11, patterned radiation beams 606 are applied to expose the resist film 604.

Figure 12:
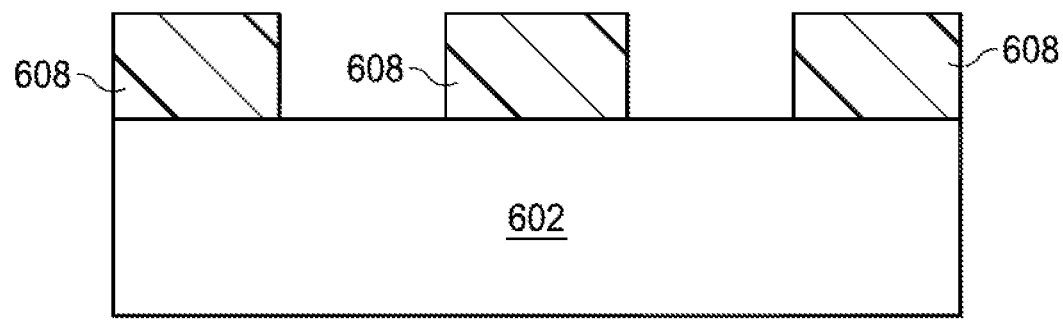

The method 500 proceeds to operation 508 by applying a developer on an exposed resist film 604 to form a resist pattern 608 on the substrate 602, as illustrated in FIG. 12. In some embodiments, a developer includes a water based developer, such as tetramethylammonium hydroxide (TMAH), for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying a developer on the exposed resist film, for example by a spin-on process. Applying a developer also include using a post exposure bake (PEB), a post develop bake (PDB) process, or a combination thereof.

Figure 13:
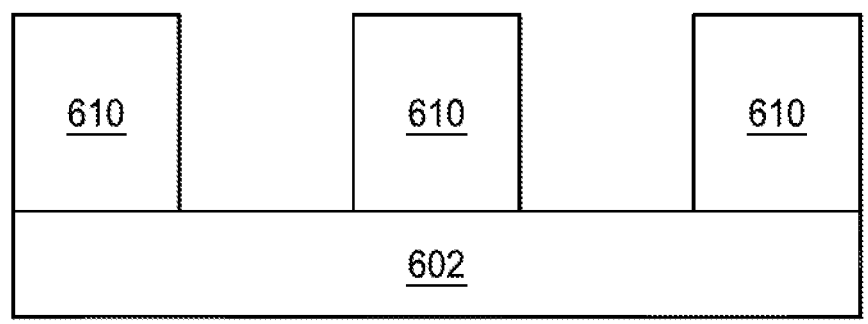

The method 500 proceeds to operation 510 by transferring the resist pattern to the wafer substrate. As illustrated in FIG. 13, a substrate pattern 610 is formed on the substrate 602. In some embodiments, transferring the resist pattern 608 to the substrate 602 includes performing an etching process to the substrate 602 using the resist pattern as an etch mask, and removing the resist by wet stripping or plasma ashing. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The etching process may further include using a cleaning process.

Thus, the present disclosure provides embodiments of a method of exposing a wafer substrate. The method includes receiving an integrated circuit (IC) design layout defining a pattern; determining a temperature profile of a mask based on the IC design layout, wherein the pattern is formed on the mask; calculating a pre-corrected overlay shift for the mask based on the calculated temperature profile; and exposing a resist layer coated on a substrate using the mask with overlay compensation based on the pre-corrected overlay shift.

The present disclosure also provides other embodiments of a method that includes coating a resist film on a substrate; exposing the resist film in a lithography system using a mask, wherein overlay shift is compensated according to a mask temperature profile that is determined based on mask data and exposing data; and developing the exposed resist film to form a pattern resist film.

The present disclosure provides embodiments of a lithography system. The lithography system includes an exposing tool designed to expose a resist layer coated on a substrate using a mask; an integrated circuit (IC) design layout database having an IC design layout defined on the mask; and a smart overlay controller to calculate a predicted overlay using a temperature profile of the mask and creates a sub-recipe to compensate overlay shift.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of exposing a wafer substrate, the method comprising:

receiving an integrated circuit (IC) design layout defining a pattern;

determining a temperature profile of a mask, wherein the pattern is formed on the mask, wherein the temperature profile is a predicted temperature of the mask predicted to occur during processing of the substrate, wherein determining the temperature profile of the mask includes determining a heating profile defined in a formula $T=a1-b1*exp(-c1*x)$, wherein:

T is mask temperature;

x is a number of exposed substrates in a lot; and a1, b1 and c1 are coefficients determined by mask data and exposing data;

calculating a pre-corrected overlay shift for the mask based on the temperature profile of the mask; and exposing a resist layer coated on a substrate using the mask with overlay compensation based on the pre-corrected overlay shift.

2. The method of claim 1, further comprising developing the resist layer to form a patterned resist layer on the substrate after the exposing a resist layer.

3. The method of claim 1, further comprising measuring overlay shift of the patterned resist layer.

4. The method of claim 3, further comprising optimizing the pre-corrected overlay shift based on the measured overlay shift of the patterned resist layer.

5. The method of claim 1, wherein the temperature profile is determined based on mask data from the IC design layout.

6. The method of claim 5, wherein the mask data includes mask transmission rate and mask pattern density.

7. The method of claim 5, wherein the temperature profile is determined further based on exposing data.

8. The method of claim 7, wherein the exposing data includes exposure dosage and exposure field size.

9. The method of claim 1, wherein c1 is function of the mask data and the exposing data, defined in a formula $c1=y0+y1*F+y2*Tr+y3*PD$ wherein F is exposure field size;

Tr is mask transmission rate;

PD is mask pattern density; and y0, y1, y2, and y3 are constants.

10. The method of claim 1, wherein determining the temperature profile of the mask further includes determining a cooling profile defined in a formula $T=exp(-c2*(x-d2))$, wherein T is mask temperature;

x is cooling time; and c2 and d2 are coefficients determined by mask data and exposing data.

11. The method of claim 10, wherein c2 is function of the mask data and the exposing data, defined in a formula $c2=z0+z1*Tr+z2*PD$ wherein Tr is mask transmission rate;

PD is mask pattern density; and z0, z1, and z2 are constants.

12. The method of claim 1, wherein the temperature profile includes temperature distribution on the mask.

13. The method of claim 1, wherein the temperature profile of the mask further includes a cooling profile defined in a formula $T=exp(-c2*(x-d2))$, wherein T is mask temperature;

x is cooling time; and c2 and d2 are coefficients determined by mask data and exposing data.

14. A method, comprising:

coating a resist film on a substrate;

exposing the resist film in a lithography system using a mask, wherein overlay shift is compensated according to a mask temperature profile, wherein the temperature profile is a predicted temperature of the mask predicted to occur during processing of the substrate, wherein determining the temperature profile of the mask includes determining a cooling profile defined in a formula T =exp(-c2*(x-d2)), wherein:

T is mask temperature;

x is cooling time; and c2 and d2 are coefficients determined by mask data and exposing data; and developing the exposed resist film to form a pattern resist film.

15. The method of claim 14, wherein the exposing the resist film includes:

receiving an IC design layout that defines a pattern formed on the mask;

determining a temperature profile of the mask based on the IC design layout;

calculating a pre-corrected overlay shift for the mask based on the calculated temperature profile; and exposing a resist film using the mask with overlay compensation based on the pre-corrected overlay shift.

16. The method of claim 15, wherein the temperature profile is determined further based on exposing data selected from the group consisting of exposure dosage, exposure field size, and a combination thereof.

17. The method of claim 14, further comprising:

measuring overlay shift of the patterned resist film; and optimizing the pre-corrected overlay shift based on the measured overlay shift.

18. The method of claim 14, wherein determining the temperature profile of the mask further includes determining a heating profile defined in a formula T =a1- b1*exp(-c1*x), wherein T is mask temperature;

x is a number of exposed substrates in a lot; and a1, b1 and c1 are coefficients determined by mask data and exposing data.

19. A lithography system, comprising:

an exposing tool designed to expose a resist layer coated on a substrate using a mask;

an integrated circuit (IC) design layout database having an IC design layout defined on the mask; and a smart overlay controller to calculate a predicted overlay using a temperature profile of the mask, wherein the temperature profile is a predicted temperature of the mask predicted to occur during processing of the substrate, wherein the temperature profile of the mask includes a heating profile defined in a formula T =a1-b1*exp(-c1*x), wherein:

T is mask temperature;

x is a number of exposed substrates in a lot; and a1, b1 and c1 are coefficients determined by mask data and exposing data.

20. The lithography system of claim 19, wherein c1 is function of the mask data and the exposing data, defined in a formula c1=y0+y1*F +y2*Tr +y3*PD wherein F is exposure field size;

Tr is mask transmission rate;

PD is mask pattern density; and y0, y1, y2, and y3 are constants.

* * * * *